United States Patent
Yao et al.

(10) Patent No.: US 9,699,901 B2
(45) Date of Patent: Jul. 4, 2017

(54) GOLDEN FINGER AND BOARD EDGE INTERCONNECTING DEVICE

(71) Applicant: Huawei Technologies Co., Ltd., Shenzhen (CN)

(72) Inventors: Kai Yao, Shenzhen (CN); Yongfa Zhu, Shenzhen (CN); Yingpei Huang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 185 days.

(21) Appl. No.: 14/016,398

(22) Filed: Sep. 3, 2013

(65) Prior Publication Data

US 2014/0004720 A1   Jan. 2, 2014

Related U.S. Application Data

(63) Continuation of application No. PCT/CN2012/083539, filed on Oct. 26, 2012.

(30) Foreign Application Priority Data

Jan. 19, 2012   (CN) .......................... 2012 1 0017504

(51) Int. Cl.
*H05K 5/00* (2006.01)
*H05K 1/11* (2006.01)
(Continued)

(52) U.S. Cl.
CPC ........... *H05K 1/117* (2013.01); *H05K 1/0265* (2013.01); *H05K 1/0298* (2013.01);
(Continued)

(58) Field of Classification Search
CPC .... H05K 1/117; H05K 1/0213; H05K 1/0216; H05K 1/0218; H05K 1/0219;
(Continued)

(56) References Cited

U.S. PATENT DOCUMENTS 5,121,297 A * 6/1992 Haas .................... H05K 3/4691
174/254
5,461,196 A * 10/1995 Virga ..................... H01L 23/13
174/262
(Continued)

FOREIGN PATENT DOCUMENTS

CN        201042106 Y    3/2008
CN        101296556 A    10/2008
(Continued)

OTHER PUBLICATIONS

Foreign Communication From a Counterpart Application, Chinese Application No. 201210017504.5, Chinese Office Action dated Jul. 17, 2013, 6 pages.
(Continued)

*Primary Examiner* — Pete Lee
(74) *Attorney, Agent, or Firm* — Conley Rose, P.C.

(57) ABSTRACT

A golden finger and a board edge interconnecting device are disclosed. The golden finger includes a printed circuit board (PCB) surface layer and at least one PCB inner layer, where a metal foil of the PCB inner layer is connected to a metal foil of the PCB surface layer through a current-carrying structure, so that a current-carrying channel of the golden finger passes through the PCB surface layer and the PCB inner layer. The board edge interconnecting device includes the foregoing golden finger. In the embodiments, a current-carrying capacity of a PCB in the golden finger is increased without increasing a size and thickness of a copper foil of the PCB in the golden finger, thereby effectively improving the current-carrying capacity of the PCB in the golden finger.

13 Claims, 3 Drawing Sheets

(51) Int. Cl.
  *H05K 1/02* (2006.01)
  *H05K 3/40* (2006.01)
(52) U.S. Cl.
  CPC ..... *H05K 3/4046* (2013.01); *H05K 2201/0919* (2013.01); *H05K 2201/0979* (2013.01); *H05K 2201/09481* (2013.01); *H05K 2201/10416* (2013.01)
(58) Field of Classification Search
  CPC .. H05K 1/0224; H05K 1/0227; H05K 1/0228; H05K 1/0236; H05K 1/0237; H05K 1/0239; H05K 1/024; H05K 1/0242; H05K 1/0245; H05K 1/0246; H05K 1/0248; H05K 1/0254; H05K 1/0256; H05K 1/0257; H05K 1/0259; H05K 1/026; H05K 1/0263; H05K 1/0265; H05K 1/0278; H05K 1/0284; H05K 1/0296; H05K 1/0298; H05K 1/036; H05K 1/0366; H05K 1/0373; H05K 1/0393; H05K 1/148; H05K 1/189; H05K 2201/042; H05K 2201/046; H05K 2201/05; H05K 2201/0332; H05K 1/00; H05K 1/02; H05K 1/021; H05K 1/0212; H05K 1/0215; H05K 1/023; H05K 1/0231; H05K 1/0233; H05K 1/0234; H05K 3/429; H05K 1/112; H05K 3/4046; H05K 2201/0919; H05K 2201/10416; H05K 2201/09481; H05K 1/111; H05K 1/114; H05K 1/119; H05K 1/14; H05K 1/142; H05K 2201/09872; H05K 2201/10378; H05K 3/4602; H05K 3/4691; H05K 1/0277; H05K 1/028; H05K 1/0281; H05K 1/0283; H01L 24/50
  USPC .................................................. 174/250, 262
  See application file for complete search history.

(56) References Cited

U.S. PATENT DOCUMENTS

| | | | | |
|---|---|---|---|---|
| 5,611,876 | A * | 3/1997 | Newton | H01L 21/4857 156/252 |
| 6,020,219 | A * | 2/2000 | Dudderar | H01L 23/04 257/E21.505 |
| 6,833,512 | B2 * | 12/2004 | Liu | H05K 1/113 174/260 |
| 8,315,678 | B2 * | 11/2012 | Uchaykin | 505/220 |
| 2003/0131472 | A1 | 7/2003 | Cheng et al. | |
| 2006/0032666 | A1 | 2/2006 | Kim et al. | |
| 2006/0049130 | A1 * | 3/2006 | Watanabe | H05K 3/4611 216/13 |
| 2007/0074901 | A1 | 4/2007 | Takizawa | |
| 2008/0277145 | A1 | 11/2008 | Lin et al. | |
| 2009/0110916 | A1 * | 4/2009 | Ostrovsky | 428/336 |
| 2010/0148375 | A1 * | 6/2010 | Jiang | G06F 17/5072 257/778 |
| 2010/0236823 | A1 * | 9/2010 | Hu | H05K 1/116 174/262 |
| 2011/0198646 | A1 * | 8/2011 | Wu | H01L 33/60 257/98 |
| 2012/0325530 | A1 | 12/2012 | Huang | |

FOREIGN PATENT DOCUMENTS

| | | |
|---|---|---|
| CN | 101442880 A | 5/2009 |
| CN | 102076181 A | 5/2011 |
| CN | 201839510 U | 5/2011 |
| CN | 201967249 U | 9/2011 |
| CN | 102264194 A | 11/2011 |
| CN | 102548205 A | 7/2012 |
| JP | 1995312268 A | 11/1995 |
| JP | 2009218287 A | 9/2009 |
| JP | 2010067668 A | 3/2010 |
| TW | 417743 U | 1/2001 |

OTHER PUBLICATIONS

Foreign Communication From a Counterpart Application, PCT Application No. PCT/CN2012/083539, Chinese Search Report dated Feb. 7, 2013, 8 pages.

Foreign Communication From a Counterpart Application, PCT Application No. PCT/CN2012/083539, Chinese Written Opinion dated Feb. 7, 2013, 6 pages.

Foreign Communication From a Counterpart Application, European Application No. 12861057.3, Extended European Search Report dated Feb. 25, 2014, 6 pages.

Foreign Communication From a Counterpart Application, European Application No. 12861057.3, European Notice of Allowance dated Mar. 24, 2015, 7 pages.

* cited by examiner

GOLDEN FINGER AND BOARD EDGE INTERCONNECTING DEVICE

CROSS-REFERENCE TO RELATED APPLICATIONS

This application is a continuation of International Application No. PCT/CN2012/083539, filed on Oct. 26, 2012, which claims priority to Chinese Patent Application No. 201210017504.5, filed on Jan. 19, 2012, both of which are hereby incorporated by reference in their entireties.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to communications technologies, and in particular, to a golden finger and a board edge interconnecting device.

BACKGROUND

With the continuous increase of power density of a power supply product, a current flowing through the product is gradually increased, and it can be seen that the power supply product is developed towards a direction of miniaturization, high power, and high current. A golden finger means that a copper foil on a surface layer of a printed circuit board (PCB) is plated with gold, so as to enhance wear resistance performance and improve reliability; and signal or energy transfer may be implemented by contacting a PCB surface layer in the golden finger with a spring plate of a golden finger connector. Therefore, it can be seen that product space may be effectively saved by using the golden finger and the golden finger connector in combination, so as to improve power density of a product. The golden finger has been widely applied in conventional electronic products, for example, used as a conductive contact plate for transferring a signal between computer hardware such as a memory board and a memory slot, and a graphics card and a graphics card slot; and in recent years, the golden finger has been gradually applied in power supply products and is used for transfer of a power signal such as current. However, compared with a design in which interconnection of two connectors is adopted, a biggest defect of the design of the golden finger is that the PCB in the golden finger has a low current-carrying capacity and generally cannot transfer a large current. Therefore, how to effectively improve the current-carrying capacity of the PCB in the golden finger has become a key technology in future designs and applications of the golden finger.

In the prior art, in order to enhance the current-carrying capacity of the PCB in the golden finger, generally, the current-carrying capacity of the PCB is improved by increasing a size of a copper foil of the PCB in the golden finger that transfers a current, that is, by increasing an area of copper of the PCB in the golden finger.

However, in the prior art, due to restriction of miniaturization of an electronic product, a size of a copper foil of a PCB in most golden fingers cannot be increased, which causes that the current-carrying capacity of a PCB in a golden finger cannot be effectively improved.

SUMMARY

Embodiments of the present invention provide a golden finger and a board edge interconnecting device, thereby effectively improving a current-carrying capacity of a PCB in a golden finger.

A first aspect of the embodiments of the present invention provides a golden finger, including a PCB surface layer and at least one PCB inner layer, where a metal foil of the PCB inner layer is connected to a metal foil of the PCB surface layer through a current-carrying structure, so that a current-carrying channel of the golden finger passes through the PCB surface layer and the PCB inner layer.

Another aspect of the embodiments of the present invention provides a board edge interconnecting device, including the foregoing golden finger.

The technical effects of the embodiments of the present invention are that, in the embodiments, a copper foil of the PCB inner layer in the golden finger is connected to a copper foil of the PCB surface layer, and the current-carrying capacity of the PCB in the golden finger is increased without increasing a size and thickness of a copper foil of the PCB in the golden finger, thereby effectively improving the current-carrying capacity of the PCB in the golden finger.

DETAILED DESCRIPTION

To make the objectives, technical solutions, and advantages of the embodiments of the present invention more comprehensible, the following clearly describes the technical solutions in the embodiments of the present invention with reference to the accompanying drawings in the embodiments of the present invention. Apparently, the embodiments to be described are merely part rather than all of the embodiments of the present invention. All other embodiments obtained by persons of ordinary skill in the art based on the embodiments of the present invention without creative efforts shall fall within the protection scope of the present invention.

This embodiment provides a golden finger, where the golden finger is formed by multiple PCB layers, and specifically includes a PCB surface layer and at least one PCB inner layer. In this embodiment, a current-carrying structure is designed in an interior of a PCB of the golden finger, a metal foil of the PCB inner layer is connected to a metal foil of the PCB surface layer through the current-carrying structure, so that a current-carrying channel of the golden finger may pass through the PCB surface layer and the PCB inner layer. The metal foil may specifically be a copper foil, and in this embodiment, a copper foil of the PCB inner layer in the golden finger is connected to a copper foil of the PCB surface layer, and a current-carrying capacity of the PCB in the golden finger is increased without increasing a size and thickness of a copper foil of the PCB in the golden finger, thereby effectively improving the current-carrying capacity of the PCB in the golden finger.

Figure 1:
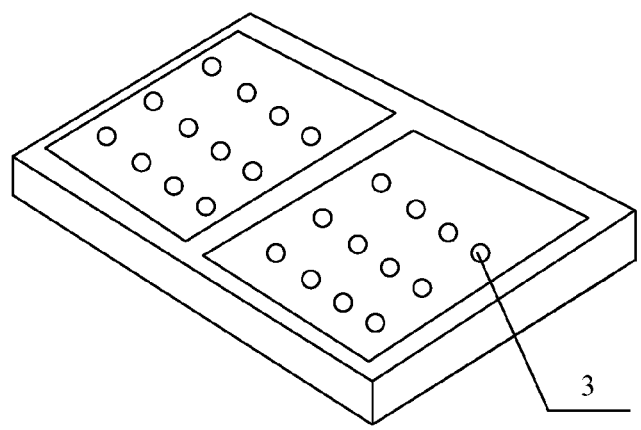
FIG. 1 is a schematic structural diagram of a surface of a golden finger according to Embodiment 1 of a golden finger of the present invention.
Figure 2:
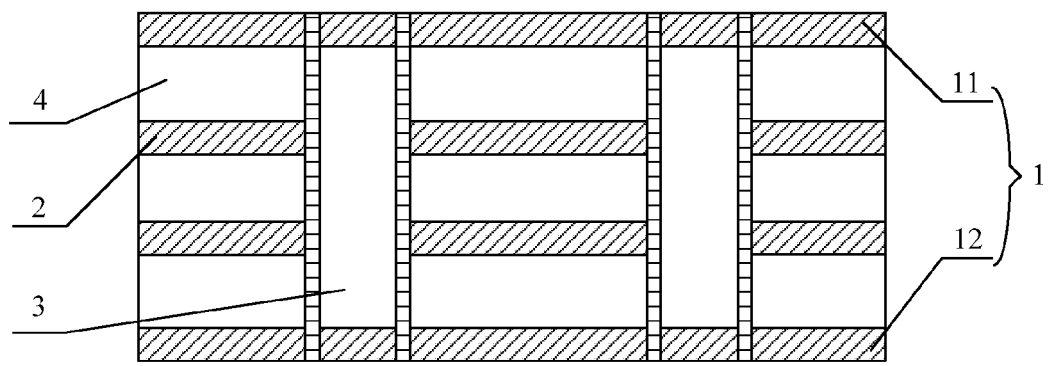
FIG. 2 is a schematic cross-sectional diagram of an interior of the golden finger according to Embodiment 1 of a golden finger of the present invention.

FIG. 1 and FIG. 2 are respectively a schematic structural diagram of a surface of a golden finger according to Embodiment 1 of a golden finger of the present invention and a schematic cross-sectional diagram of an interior of the golden finger according to Embodiment 1 of a golden finger of the present invention. As shown in FIG. 1 and FIG. 2, this embodiment provides a golden finger, where the golden finger provided by this embodiment includes a PCB surface layer 1 and at least one PCB inner layer 2, where an insulation layer 4 exists between the PCB surface layer 1 and the PCB inner layer 2. The foregoing FIG. 2 is a schematic enlarged diagram of a partial cross-section of the interior of the golden finger. In this embodiment, a disposed current-carrying structure specifically is a via structure, that is, a certain number of vias 3 are disposed between the PCB surface layer 1 and the PCB inner layer 2, and as shown in FIG. 1, in this embodiment, a certain number of vias 3 are designed on a pin of a PCB in the golden finger, where a via is a metallized hole used for inner layer connection and is not used for insertion of a component lead or other reinforced materials, and in this embodiment, the via 3 is disposed to penetrate an insulation layer located between the PCB surface layer 1 and the PCB inner layer 2, so that the via 3 may connect a copper foil of the PCB surface layer to a copper foil of the PCB inner layer. A specific position of the via 3 and the number of vias 3 may be set according to actual situations. As shown in FIG. 2, a metal foil of the PCB surface layer 1 may be connected to a metal foil of the PCB inner layer 2 by disposing a via 3 between the PCB surface layer 1 and the PCB inner layer 2, so that a power signal such as current not only may be transferred through the metal foil of the PCB surface layer 1, but also may be transferred through the metal foil of the PCB inner layer 2, thereby achieving a purpose of increasing a current-carrying capacity of the PCB in the golden finger and improving the current-carrying capacity of the PCB in the golden finger.

Specifically, as shown in FIG. 2, in this embodiment, the PCB surface layer 1 in the golden finger may specifically include a PCB upper layer 11 and a PCB lower layer 12, and a type of a via 3 disposed between the PCB surface layer 1 and the PCB inner layer 2 may include, but is not limited to, a through hole, a blind via, a buried via, and so on. The blind via is a via that merely extends from an interior of a printed board to one surface layer, the buried via is a via that does not extend to a surface of a printed board, and the through hole is a via that extends from one surface layer of a printed board to another surface layer.

Specifically, in this embodiment, the via 3 may specifically be any one or a combination of two of a through hole disposed between the PCB upper layer 11 and the PCB lower layer 12, and a blind via disposed between the PCB upper layer 11 and the PCB inner layer 2 or between the PCB lower layer 12 and the PCB inner layer 2. Or, in this embodiment, the via 3 is a combination of a buried via disposed between PCB inner layers 2 and a through hole disposed between the PCB upper layer 11 and the PCB lower layer 12. Or, in this embodiment, the via 3 is a combination of a buried via disposed between PCB inner layers 2 and a blind via disposed between the PCB upper layer 11 and the PCB inner layer 2 or between the PCB lower layer 12 and the PCB inner layer 2.

More specifically, in this embodiment, in order to connect the PCB surface layer to the PCB inner layer in the golden finger, a certain number of through holes may be disposed for implementation. Specifically, a certain number of through holes are disposed between the PCB upper layer 11 and the PCB lower layer 12, and because the through hole may extend from one surface layer of the PCB to another surface layer, that is, extend from the PCB upper layer 11 to the PCB lower layer 12, and penetrate the insulation layer 4 between the PCB upper layer 11 and the PCB lower layer 12, the PCB upper layer 11, the PCB lower layer 12, and the PCB inner layer 2 are directly connected together, and a power signal such as current not only may be transferred through metal foils of the PCB upper layer 11 and the PCB lower layer 12, but also may be transferred through a metal foil of the PCB inner layer 2, thereby increasing a current-carrying capacity of the PCB in the golden finger. Or, this embodiment may also be implemented by disposing a certain number of blind vias for implementation. Specifically, a certain number of blind vias are disposed between the PCB upper layer 11 and the PCB inner layer 2, and because the blind via may extend from one surface layer of the PCB to the interior of the PCB, that is, extend from the PCB upper layer 11 to the PCB inner layer 2, and penetrate the insulation layer 4 between the PCB upper layer 11 and the PCB inner layer 2, the PCB upper layer 11 and the PCB inner layer 2 are directly connected together, and a power signal such as current not only may be transferred through metal foils of the PCB upper layer 11 and the PCB lower layer 12, but also may be transferred through a metal foil of the PCB inner layer 2, thereby increasing a current-carrying capacity of the PCB in the golden finger. Or, this embodiment may also be implemented by disposing a combination of a certain number of blind vias and through holes for implementation. Specifically, a certain number of through holes are disposed between the PCB upper layer 11 and the PCB lower layer 12, and at the same time, a certain number of blind vias are disposed between the PCB upper layer 11 and the PCB inner layer 2, so that the PCB upper layer 11, the PCB lower layer 12, and the PCB inner layer 2 are directly connected together, and a power signal such as current not only may be transferred through metal foils of the PCB upper layer 11 and the PCB lower layer 12, but also may be transferred through a metal foil of the PCB inner layer 2, thereby increasing a current-carrying capacity of the PCB in the golden finger.

More specifically, in this embodiment, in order to connect the PCB surface layer to the PCB inner layer in the golden finger, a combination of a certain number of buried vias and through holes may be specifically disposed for implementation, a certain number of buried vias are disposed between two or more than two PCB inner layers 2 in the golden finger, and a certain number of through holes are disposed between the PCB upper layer 11 and the PCB lower layer 12. Because the buried via does not extend to the PCB surface layer, but the through hole may extend from the PCB upper layer 11 to the PCB lower layer 12, a combination of the buried vias and the through holes may still penetrate the insulation layer 4 between the PCB upper layer 11 and the PCB lower layer 12, so that the PCB upper layer 11, the PCB lower layer 12, and the PCB inner layer 2 are directly connected together, and a power signal such as current not only may be transferred through the metal foils of the PCB upper layer 11 and the PCB lower layer 12, but also may be transferred through the metal foil of the PCB inner layer 2, thereby increasing a current-carrying capacity of the PCB in the golden finger.

More specifically, in this embodiment, in order to connect the PCB surface layer to the PCB inner layer in the golden finger, a combination of a certain number of blind vias and buried vias may be disposed for implementation. Specifically, a certain number of buried vias are disposed between two or more than two PCB inner layers 2 in the golden finger, and a certain number of blind vias are disposed between the PCB upper layer 11 and the PCB inner layer 2. Because the buried via does not extend to the PCB surface layer, but the blind via may extend from the PCB inner layer to the PCB surface layer, a combination of the buried vias and the through holes may still penetrate the insulation layer 4 between the PCB upper layer 11 and the PCB inner layer 2, so that the PCB upper layer 11 and the PCB inner layer 2 are directly connected together, and a power signal such as current not only may be transferred through the metal foils of the PCB upper layer 11 and the PCB lower layer 12, but also may be transferred through the metal foil of the PCB inner layer 2, thereby increasing a current-carrying capacity of the PCB in the golden finger. Or, in this embodiment, a certain number of buried vias may also be specifically disposed between two or more than two PCB inner layers 2 in the golden finger, and a certain number of blind vias is disposed between the PCB lower layer 12 and the PCB inner layer 2. Because the buried via does not extend to the PCB surface layer, but the blind via may extend from the PCB inner layer to the PCB surface layer, a combination of the buried vias and the through holes may still penetrate the insulation layer 4 between the PCB lower layer 12 and the PCB inner layer 2, so that the PCB lower layer 12 and the PCB inner layer 2 are directly connected together, and a power signal such as current not only may be transferred through the metal foils of the PCB upper layer 11 and the PCB lower layer 12, but also may be transferred through the metal foil of the PCB inner layer 2, thereby increasing a current-carrying capacity of the PCB in the golden finger.

Figure 3:
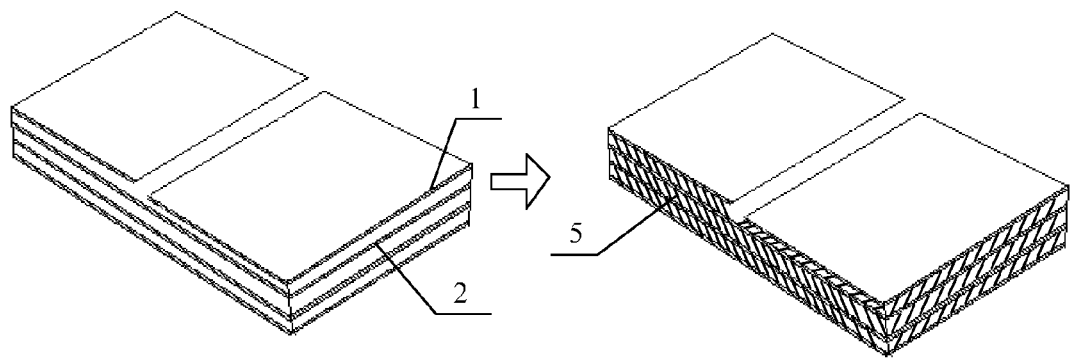
FIG. 3 is schematic structural diagrams of a surface of a golden finger before and after a sidewall is plated with a metal according to Embodiment 2 of a golden finger of the present invention.

FIG. 3 is schematic structural diagrams of a surface of a golden finger before and after a sidewall is plated with a metal according to Embodiment 2 of a golden finger of the present invention, and as shown in FIG. 3, this embodiment provides a golden finger, where the golden finger provided by this embodiment includes a PCB surface layer 1 and at least one PCB inner layer 2. In this embodiment, a disposed current-carrying structure specifically is a sidewall metallization structure, that is, an edge of a PCB in the golden finger adopts the sidewall metallization structure, and a metal foil of the PCB inner layer 2 is connected to a metal foil of the PCB surface layer 1 through the sidewall metallization structure 5. FIG. 3 shows a change of a structure of the golden finger before and after a sidewall is plated with a metal, and it can be seen from FIG. 3 that, in this embodiment, the sidewall metallization structure specifically is that an edge position of the PCB in the golden finger is plated with a metal and a non-edge position of each layer of the PCB does not need to be plated with a metal, so as to connect each layer of the PCB through the plated metal, and increase a current-carrying capacity of the PCB in the golden finger without increasing a size and thickness of a copper foil of the PCB in the golden finger. Specifically, in this embodiment, the sidewall metallization structure specifically is a sidewall copperization structure, that is, an edge position of the PCB in the golden finger adopts a copperization design.

More specifically, in this embodiment, an edge of the PCB may specifically include an edge of the PCB surface layer, an edge of the PCB inner layer, an edge of a PCB pin, and an edge after an interior of the PCB in the golden finger is notched. In this embodiment, the edge of the PCB surface layer, the edge of the PCB inner layer, the edge of the PCB pin, and the edge after the interior of the PCB in the golden finger is notched adopt the sidewall copperization structure, that is, sidewall copperization processing is performed on the edge of the PCB surface layer, the edge of the PCB inner layer, the edge of the PCB pin, and the edge after the interior of the PCB in the golden finger is notched, so that a copper foil of the PCB inner layer in the golden finger is connected to a copper foil of the PCB surface layer, and a current-carrying capacity of the PCB in the golden finger is increased without increasing a size and thickness of a copper foil of the PCB in the golden finger, thereby effectively improving the current-carrying capacity of the PCB in the golden finger.

Figure 4:
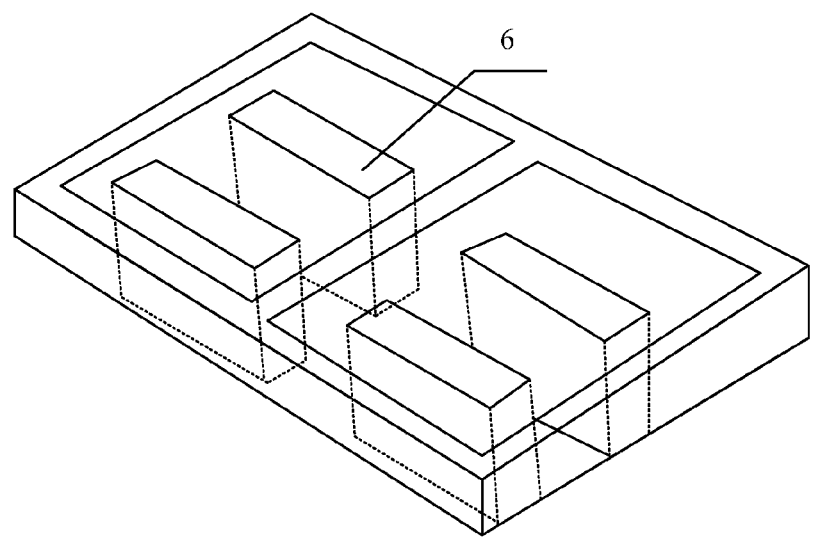
FIG. 4 is a schematic structural diagram of an interior of a golden finger according to Embodiment 3 of a golden finger of the present invention.

FIG. 4 is a schematic structural diagram of an interior of a golden finger according to Embodiment 3 of a golden finger of the present invention, and as shown in FIG. 4, this embodiment provides a golden finger, where the golden finger includes a PCB surface layer and at least one PCB inner layer, where an insulation layer exists between the PCB surface layer and the PCB inner layer. In this embodiment, a disposed current-carrying structure specifically is a conductive block structure, that is, a certain number of conductive blocks 6 are disposed between the PCB surface layer and the PCB inner layer, and a metal foil of the PCB inner layer is connected to a metal foil of the PCB surface layer through a conductive block 6. In this embodiment, the conductive block 6 may specifically be inserted into the insulation layer between the PCB surface layer and the PCB inner layer, and a shape, a position, a size, the number and an arrangement manner of the conductive block 6 may be set according to actual situations. In the embodiment, a copper foil of the PCB inner layer in the golden finger is connected to a copper foil of the PCB surface layer through a conductive block, and a current-carrying capacity of the PCB in the golden finger is increased without increasing a size and thickness of a copper foil of the PCB in the golden finger, thereby effectively improving the current-carrying capacity of the PCB in the golden finger.

Figure 5:
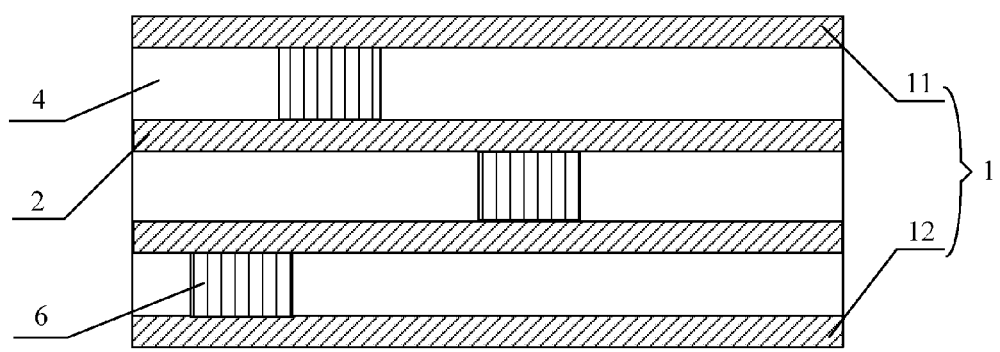
FIG. 5 is a schematic cross-sectional diagram of the interior of the golden finger according to Embodiment 3 of a golden finger of the present invention.

Specifically, FIG. 5 is a schematic cross-sectional diagram of the interior of the golden finger according to Embodiment 3 of a golden finger of the present invention, and as shown in FIG. 5, in this embodiment, the PCB surface layer 1 may include a PCB upper layer 11 and a PCB lower layer 12, and in this embodiment, a conductive block 6 may be disposed between the PCB upper layer 11 and the PCB inner layer 2, so that a metal foil of the PCB inner layer 2 is connected to a metal foil of the PCB upper layer 11, and a power signal such as current not only may be transferred by metal foils of the PCB upper layer 11 and the PCB lower layer 12, but also may be transferred through a metal foil of the PCB inner layer 2, thereby increasing a current-carrying capacity of a PCB in the golden finger.

Or, in this embodiment, the conductive block 6 may be disposed between the PCB lower layer 12 and the PCB inner layer 2, so that a metal foil of the PCB inner layer 2 is connected to a metal foil of the PCB lower layer 12, and a power signal such as current not only may be transferred through metal foils of the PCB upper layer 11 and the PCB lower layer 12, but also may be transferred through a metal foil of the PCB inner layer 2, thereby increasing a current-carrying capacity of a PCB in the golden finger.

Or, in this embodiment, the conductive block 6 may be disposed between the PCB upper layer 11 and the PCB inner layer 2, and is disposed between the PCB lower layer 12 and the PCB inner layer 2 at the same time, so that a metal foil of the PCB inner layer 2 is connected to a metal foil of the PCB upper layer 11, and the metal foil of the PCB inner layer 2 is connected to the metal foil of the PCB lower layer 12, and a power signal such as current not only may be transferred through metal foils of the PCB upper layer 11 and the PCB lower layer 12, but also may be transferred through a metal foil of the PCB inner layer 2, thereby increasing a current-carrying capacity of a PCB in the golden finger.

Or, in this embodiment, the conductive block 6 may be disposed between the PCB upper layer 11 and the PCB inner layer 2, and is disposed between two PCB inner layers 2 at the same time, so that a metal foil of the PCB inner layer 2 is connected to a metal foil of the PCB upper layer 11, and a power signal such as current not only may be transferred through metal foils of the PCB upper layer 11 and the PCB lower layer 12, but also may be transferred through a metal foil of the PCB inner layer 2, thereby increasing a current-carrying capacity of a PCB in the golden finger.

Or, in this embodiment, the conductive block 6 may be disposed between the PCB lower layer 12 and the PCB inner layer 2, and is disposed between two PCB inner layers 2 at the same time, so that a metal foil of the PCB inner layer 2 is connected to a metal foil of the PCB lower layer 12, and a power signal such as current not only may be transferred through metal foils of the PCB upper layer 11 and the PCB lower layer 12, but also may be transferred through a metal foil of the PCB inner layer 2, thereby increasing a current-carrying capacity of a PCB in the golden finger.

Or, in this embodiment, the conductive block 6 may be further disposed between the PCB upper layer 11 and the PCB lower layer 12, so that a metal foil of the PCB inner layer 2 is connected to metal foils of the PCB upper layer 11 and the PCB lower layer 12, and a power signal such as current not only may be transferred through metal foils of the PCB upper layer 11 and the PCB lower layer 12, but also may be transferred through a metal foil of the PCB inner layer 2, thereby increasing a current-carrying capacity of a PCB in the golden finger.

This embodiment further provides a board edge interconnecting device, which may specifically include the golden finger shown in any one of FIG. 1 to FIG. 5.

Finally, it should be noted that the foregoing embodiments are merely intended for describing the technical solutions of the present invention, rather than limiting the present invention. Although the present invention is described in detail with reference to the foregoing embodiments, persons of ordinary skill in the art should understand that they may still make modifications to the technical solutions described in the foregoing embodiments, or make equivalent replacements to part or all of the technical features of the technical solutions described in the foregoing embodiments; however, these modifications or replacements do not make the essence of the corresponding technical solutions depart from the scope of the technical solutions of the embodiments of the present invention.

What is claimed is:

1. A golden finger, comprising:
   a printed circuit board (PCB) surface layer;
   at least one PCB inner layer; and
   an insulation layer between the PCB surface layer and the at least one PCB inner layer,
   wherein a metal foil of the PCB inner layer is connected to a metal foil of the PCB surface layer through a current-carrying structure such that a current-carrying channel of the golden finger passes through the PCB surface layer and the PCB inner layer,
   wherein an edge of the golden finger comprises an edge of the PCB surface layer, an edge of the PCB inner layer, an edge of the insulation layer, an edge of a PCB pin, and an edge after an interior of the golden finger that is notched,
   wherein the edge of the PCB surface layer, the edge of the PCB inner layer, the edge of the insulation layer, the edge of the PCB pin, and the edge after the interior of the golden finger that is notched form at least four sidewalls of the golden finger,
   wherein the at least four sidewalls of the golden finger comprise a sidewall copperization such that an entire surface of each of the at least four sidewalls of the golden finger is covered in copper,
   wherein the sidewall copperization connects the metal foil of the PCB inner layer to the metal foil of the PCB surface layer such that a current-carrying capacity of the golden finger is increased,
   wherein multiple vias are disposed between the PCB surface layer and the PCB inner layer,
   wherein the multiple vias comprise a through hole, a blind via, and a buried via,
   wherein the through hole extends from one surface layer of the PCB to another surface layer of the PCB,
   wherein the blind via extends from an interior of the PCB to the one surface layer of the PCB,
   wherein the buried via extends between PCB inner layers without extending to the one surface layer of the PCB,
   wherein the metal foil of the PCB surface layer is plated with gold, and
   wherein the PCB surface layer comprises a notch that forms a recessed groove across an entire width of a top of the golden finger.

2. The golden finger according to claim 1, wherein the metal foil of the PCB inner layer is connected to the metal foil of the PCB surface layer through the multiple vias.

3. The golden finger according to claim 2, wherein the PCB surface layers comprise:
   a PCB upper layer; and
   a PCB lower layer.

4. The golden finger according to claim 1, wherein a conductive block is disposed between the PCB surface layer and the PCB inner layer, and wherein the metal foil of the PCB inner layer is connected to the metal foil of the PCB surface layer through the conductive block.

5. The golden finger according to claim 4, wherein the PCB surface layer comprises:
   a PCB upper layer; and
   a PCB lower layer,
   wherein the conductive block is disposed between the PCB upper layer and the PCB inner layer and/or between the PCB lower layer and the PCB inner layer.

6. The golden finger according to claim 4, wherein the PCB surface layer comprises:
   a PCB upper layer; and
   a PCB lower layer,
   wherein the conductive block is disposed between the PCB upper layer and the PCB inner layer and between the PCB inner layers.

7. The golden finger according to claim 4, wherein the PCB surface layer comprises:
a PCB upper layer; and
a PCB lower layer,
wherein the conductive block is disposed between the PCB lower layer and the PCB inner layer and between the PCB inner layers.

8. The golden finger according to claim 4, wherein the PCB surface layer comprises:
a PCB upper layer; and
a PCB lower layer,
wherein the conductive block is disposed between the PCB upper layer and the PCB lower layer.

9. The golden finger according to claim 1, wherein the at least four sidewalk of the golden finger form a rectangular shape that surrounds the golden finger.

10. A golden finger, comprising:
a printed circuit board (PCB) surface layer;
at least one PCB inner layer; and
an insulation layer between the PCB surface layer and the at least one PCB inner layer,
wherein a metal foil of the PCB inner layer is connected to a metal foil of the PCB surface layer through a current-carrying structure such that a current-carrying channel of the golden finger passes through the PCB surface layer and the PCB inner layer,
wherein an edge of the golden finger comprises an edge of the PCB surface layer, an edge of the PCB inner layer, an edge of the insulation layer, an edge of a PCB pin, and an edge after an interior of the golden finger that is notched,
wherein the edge of the PCB surface layer, the edge of the PCB inner layer, the edge of the insulation layer, the edge of the PCB pin, and the edge after the interior of the golden finger that is notched form at least four sidewalls of the golden finger,
wherein the at least four sidewalls of the golden finger comprise a sidewall copperization such that an entire surface of each of the at least four sidewalk of the golden finger is covered in copper,
wherein the sidewall copperization connects the metal foil of the PCB inner layer to the metal foil of the PCB surface layer such that a current-carrying capacity of the golden finger is increased,
wherein the metal foil of the PCB surface layer is plated with gold,
wherein vias are disposed between the PCB surface layer and the PCB inner layer,
wherein the multiple vias comprise a through hole, a blind via, and a buried via,
wherein the through hole extends from one surface layer of the PCB to another surface layer of the PCB,
wherein the blind via extends from an interior of the PCB to the one surface layer of the PCB,
wherein the buried via extends between PCB inner layers without extending to the one surface layer of the PCB, and
wherein the PCB surface layer comprises a notch that forms a recessed groove across an entire width of a top of the golden finger.

11. The golden finger according to claim 10, wherein the at least four sidewalls of the golden finger form a rectangular shape that surrounds the golden finger.

12. A golden finger, comprising:
a first printed circuit board (PCB) surface layer;
a first insulation layer adjacent to the first PCB surface layer;
a first PCB inner layer adjacent to the first insulation layer;
a second insulation layer adjacent to the first PCB inner layer;
a second PCB inner layer adjacent to the second insulation layer;
a third insulation layer adjacent to the second PCB inner layer; and
a second PCB surface layer adjacent to the third insulation layer,
wherein the first PCB surface layer, the first insulation layer, the first PCB inner layer, the second insulation layer, the second PCB inner layer, the third insulation layer, and the second PCB surface layer form four outer sidewalls of the golden finger,
wherein the four outer sidewalls of the golden finger comprise a sidewall copperization such that an entire surface of each of the four outer sidewalls of the golden finger is covered in copper,
wherein a metal foil of the first PCB surface layer is plated with gold,
wherein multiple vias are disposed between the first PCB surface layer and the first PCB inner layer,
wherein the multiple vias comprise a through hole, a blind via, and a buried via,
wherein the through hole extends from one surface layer of the PCB to another surface layer of the PCB,
wherein the blind via extends from an interior of the PCB to the one surface layer of the PCB,
wherein the buried via extends between PCB inner layers without extending to the one surface layer of the PCB, and
wherein the first PCB surface layer comprises a notch that forms a recessed groove across an entire width of a top of the golden finger.

13. The golden finger according to claim 12, wherein the four outer sidewalk of the golden finger form a rectangular shape that surrounds the golden finger.

* * * * *

UNITED STATES PATENT AND TRADEMARK OFFICE
CERTIFICATE OF CORRECTION

PATENT NO. : 9,699,901 B2  
APPLICATION NO. : 14/016398  
DATED : July 4, 2017  
INVENTOR(S) : Kai Yao, Yongfa Zhu and Yingpei Huang Page 1 of 1

It is certified that error appears in the above-identified patent and that said Letters Patent is hereby corrected as shown below:

In the Claims

Column 9, Line 15, Claim 9 should read:  
least four sidewalls of the golden finger form a rectangular Column 9, Line 39, Claim 10 should read:  
surface of each of the at least four sidewalls of the Column 10, Line 52, Claim 13 should read:  
four outer sidewalls of the golden finger form a rectangular Signed and Sealed this  
Fifth Day of September, 2017

Joseph Matal  
*Performing the Functions and Duties of the*  
*Under Secretary of Commerce for Intellectual Property and*  
*Director of the United States Patent and Trademark Office*